(12) United States Patent
Schnizler

(10) Patent No.: US 10,938,513 B2
(45) Date of Patent: Mar. 2, 2021

(54) EVALUATION OF BIT ERROR VECTORS FOR SYMBOL ERROR ANALYSIS

(71) Applicant: VIAVI SOLUTIONS INC., San Jose, CA (US)

(72) Inventor: Reiner Schnizler, Eningen Unter Achalm (DE)

(73) Assignee: VIAVI SOLUTIONS INC., San Jose, CA (US)

( * ) Notice: Subject to any disclaimer, the term of this patent is extended or adjusted under 35 U.S.C. 154(b) by 23 days.

(21) Appl. No.: 16/439,262

(22) Filed: Jun. 12, 2019

(65) Prior Publication Data

US 2020/0396021 A1    Dec. 17, 2020

(51) Int. Cl.
*H04L 1/00* (2006.01)
*H04L 1/20* (2006.01)

(52) U.S. Cl.
CPC .......... *H04L 1/0045* (2013.01); *H04L 1/0041* (2013.01); *H04L 1/0061* (2013.01); *H04L 1/203* (2013.01)

(58) Field of Classification Search
CPC ..... H04L 1/0045; H04L 1/203; H04L 1/0061; H04L 1/0041
See application file for complete search history.

(56) References Cited

U.S. PATENT DOCUMENTS

| 6,684,351 B1* | 1/2004 | Bendak | H04L 1/243 714/715 |
| 10,069,596 B1* | 9/2018 | Chengson | H04L 1/0045 |
| 2008/0010661 A1 | 1/2008 | Kappler et al. | |
| 2014/0258795 A1* | 9/2014 | Schnizler | H04L 1/244 714/705 |

FOREIGN PATENT DOCUMENTS

| EP | 3293908 | 3/2018 |
| EP | 3301828 | 4/2018 |

* cited by examiner

*Primary Examiner* — Vineeta S Panwalkar
(74) *Attorney, Agent, or Firm* — Mannava & Kang, P.C.

(57) ABSTRACT

The disclosure relates to evaluating bit error vectors for symbol error analysis on real-world framed signals. Forward error correction (FEC) may generate a bit error vector to correct binary lanes such as non-return-to-zero (NRZ) lanes demultiplexed from a symbol-encoding lane such as a 4-level pulse amplitude modulation (PAM-4) lane. An apparatus may apply the bit error vector to the demultiplexed NRZ lanes to identify bit errors that occurred on the NRZ lanes. The apparatus may map the bit errors on the NRZ lanes to symbol errors on the PAM-4 lane. The apparatus may generate detailed symbol error information based on the identified symbol errors. The symbol error information may then be used for link tuning, thereby mitigating the effects of high frequency physical effects and other impairments on high-speed data links.

20 Claims, 11 Drawing Sheets

900

```
┌─────────────────────────────────────────────────────────────┐
│ Demultiplex a 4-level pulse amplitude modulation (PAM-4)    │
│ lane into at least two non-return-to-zero (NRZ) lanes       │
│                          902                                │
└─────────────────────────────────────────────────────────────┘
                              │
                              ▼
┌─────────────────────────────────────────────────────────────┐
│ Perform forward error correction on the at least two NRZ    │
│ lanes to correct bit errors that occurred on the at least   │
│ two NRZ lanes                                               │
│                          904                                │
└─────────────────────────────────────────────────────────────┘
                              │
                              ▼
┌─────────────────────────────────────────────────────────────┐
│ Generate a bit error vector based on the forward error      │
│ correction                                                  │
│                          906                                │
└─────────────────────────────────────────────────────────────┘
                              │
                              ▼
┌─────────────────────────────────────────────────────────────┐
│                 Access the bit error vector                 │
│                          908                                │
└─────────────────────────────────────────────────────────────┘
                              │
                              ▼
┌─────────────────────────────────────────────────────────────┐
│         Identify the bit errors based on the bit error      │
│                          vector                             │
│                          910                                │
└─────────────────────────────────────────────────────────────┘
                              │
                              ▼
┌─────────────────────────────────────────────────────────────┐
│   Map the bit errors to respective symbols on the PAM-4 lane│
│                          912                                │
└─────────────────────────────────────────────────────────────┘
                              │
                              ▼
┌─────────────────────────────────────────────────────────────┐
│  Generate symbol error information based on the mapped bit  │
│                          errors                             │
│                          914                                │
└─────────────────────────────────────────────────────────────┘
```

*FIG. 9*

EVALUATION OF BIT ERROR VECTORS FOR SYMBOL ERROR ANALYSIS

BACKGROUND

The use of 4-level pulse amplitude modulation (PAM-4) for high-speed data link standards, such as 400 Gigabit (G), 200G, 100G and 50G Ethernet and other high-speed transmission standards, is gaining popularity. This may be due to the high data throughput that PAM-4 provides. However, PAM-4 links (whether optical or electrical) may suffer from a number of impairments. These impairments may be caused by physical effects such as insertion loss, dispersion, reflection, crosstalk, and others. To correct bit errors resulting from these and other impairments, transmitters and receivers may implement forward error correction (FEC). FEC may be used by a receiver to correct bits on a data stream based on codewords embedded by a transmitter in the data stream.

Additionally, to reduce an occurrence of these and other impairments in the first place, techniques such as transmitter (Tx) predistortion, receiver (Rx) equalization, reflection cancelation and crosstalk cancelation may be implemented in transmitting and/or receiving devices. However, to be effective, these techniques may involve tuning (adjusting or otherwise setting) various link parameters. In order to perform proper link tuning, detailed information may be required about the error characteristics of the signal at the transmission level, such as at the PAM-4 symbol level, rather than at the bit level. However, such symbol-level error information may be unavailable since the FEC may operate at the bit level rather than at the symbol level.

Furthermore, while test pattern signals have been developed for testing link quality, these techniques may use unframed test signals, which may not approximate real-world framed signals. For example, results of testing using pseudo-random binary sequence (PRBS) and PRBS-quaternary (PRBSQ) test pattern signals may be misleading because the characteristics of these signals may differ from the characteristics of real-world framed signals.

Thus, symbol error analysis and proper link tuning is often difficult due to the use of unframed test signals for assessing link quality and the lack of detailed symbol error information.

BRIEF DESCRIPTION OF THE DRAWINGS

Features of the present disclosure may be illustrated by way of example and not limited in the following figure(s), in which like numerals indicate like elements, in which:

FIG. 9 illustrates another example method of evaluating FEC bit error vectors for symbol error analysis, according to an example of the disclosure;

DETAILED DESCRIPTION

Figure 1:
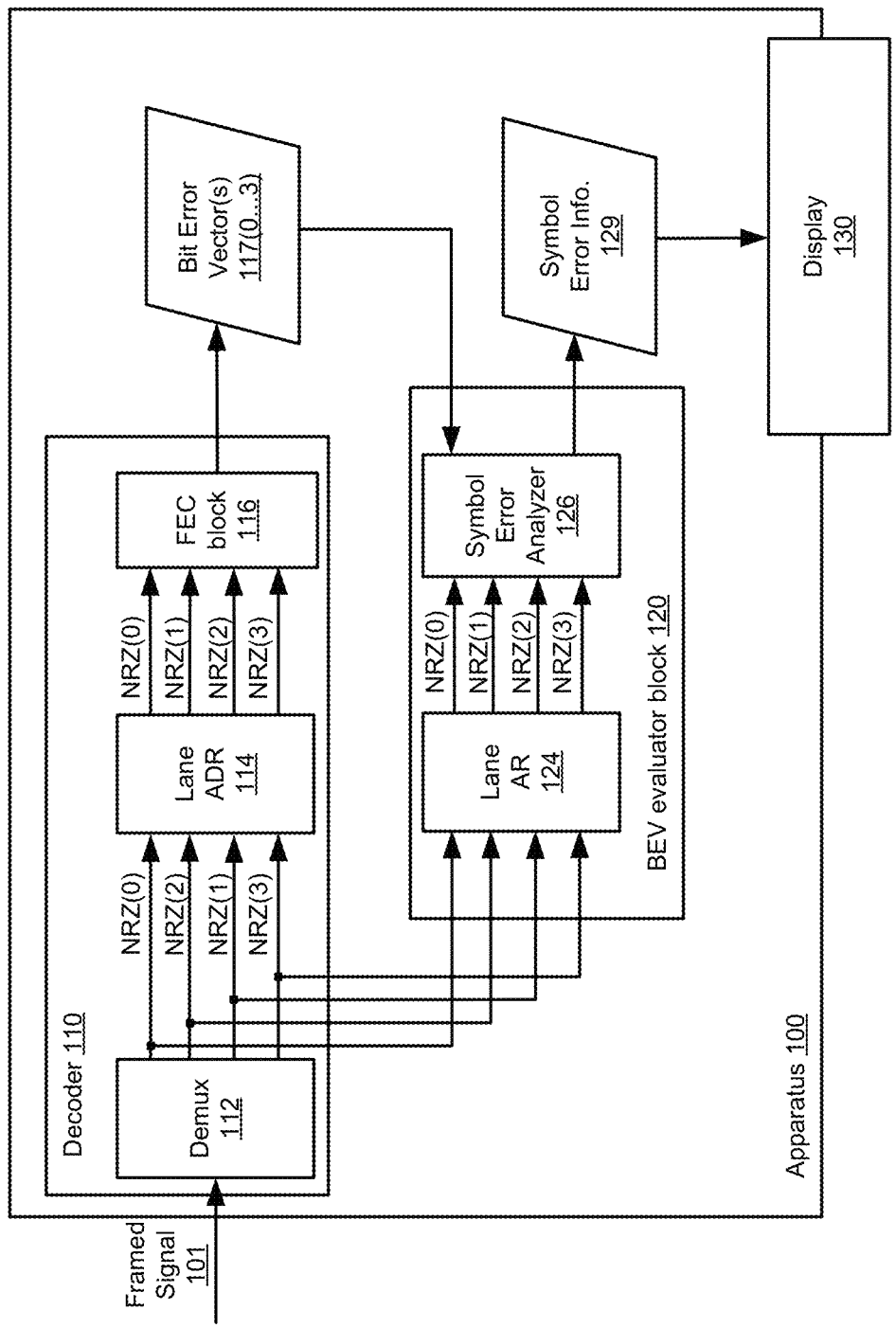
FIG. 1 illustrates an example apparatus for evaluating FEC bit error vectors for symbol error analysis, according to an example of the disclosure.

In the following description, numerous specific details are set forth in order to provide a thorough understanding of the present disclosure. It will be readily apparent however, that the present disclosure may be practiced without limitation to these specific details. In other instances, some methods and structures readily understood by one of ordinary skill in the art have not been described in detail so as not to unnecessarily obscure the description of the present disclosure. Also, for simplicity and illustrative purposes, the present disclosure is described below by referring mainly to examples. As used herein, the terms "a" and "an" are intended to denote at least one of a particular element, the term "includes" means includes but not limited to, the term "including" means including but not limited to, and the term "based on" means based at least in part on.

The present disclosure provides examples of an apparatus and testing methods for evaluating bit error vectors for symbol error analysis on real-world framed signals (such as by not using test signals), including PAM-4 data signals. The apparatus may include a test instrument or receiver device that generates detailed symbol error information based on bit error vectors from FEC that operates at the bit level. To illustrate, various examples that relate to PAM-4 will be described. However, other symbol-encoding techniques for which FEC is implemented may be used based on the disclosure herein.

PAM-4 uses four voltage levels to represent four combinations of 2 bits logic: 11, 10, 01, and 00. Each of these two bits may be mapped to a single symbol (such as PAM-4 symbols: "−3", "−1", "+1", and "+3"). The apparatus may decode the PAM-4 symbols received on a PAM-4 lane. As a result of this decoding, the apparatus may split (demultiplex) the PAM-4 lane into multiple binary encoded non-return-to-zero (NRZ) lanes. For example, the apparatus may split a 50 Gbit/s PAM-4 lane into two 25 Gbit/s NRZ lanes. In this example, a first NRZ lane of the NRZ lanes may include a PAM-4 symbol's most significant bit (MSB) data and a second NRZ lane may include the PAM-4 symbol's least significant bit (LSB) data. Thus, a bit error on an MSB and/or LSB carried on a corresponding NRZ lane decoded from a PAM-4 lane may result in a symbol error (which may occur on one or both bits of the PAM-4 symbol) on the PAM-4 lane.

The apparatus may forward NRZ lanes decoded (in other words, demultiplexed) from a PAM-4 lane to both an FEC block of the apparatus to perform FEC and a symbol error analyzer of the apparatus to perform symbol error analysis. Thus, both the FEC block and the symbol error analyzer may process NRZ lanes as the NRZ lanes existed prior to FEC.

The FEC block may perform FEC to correct bits on the NRZ lanes. Accordingly, the FEC may correct symbol errors that occur by virtue of correcting the underlying bits on the NRZ lanes. As a result, symbol error information may be lost since error correction is at the bit level. However, the FEC may generate a bit error vector that includes information relating to bit error correction. For example, the bit error vector may include information for calculating expected bits based on FEC codeword processing. The FEC block may forward the FEC processed data to downstream receiver circuitry, the details of which are omitted as they are not pertinent to the disclosure. The FEC block may also forward the bit error vector to the symbol error analyzer for symbol error analysis using the bit error vector.

The symbol error analyzer may apply the bit error vector to a copy of the NRZ lane received by the symbol error analyzer to determine an expected bit at a bit position of the NRZ lane. The symbol error analyzer may compare the expected bit to a received bit (at the bit position) of the NRZ lane. The symbol error analyzer may identify a bit error when the expected bit does not match the received bit. The symbol error analyzer may map any such bit error (which would have been corrected by the FEC block on the copy of the NRZ lane forwarded to the FEC block) to symbol errors by identifying the NRZ lane at which the bit error occurred and mapping the NRZ lane and bit position to a corresponding PAM-4 lane and a corresponding symbol. By identifying symbol errors, the apparatus may perform various types of symbol error analysis, which may drive link tuning to mitigate impairments on PAM-4 and other high-speed data links.

FIG. 1 illustrates an example apparatus 100 for evaluating FEC bit error vectors 117(0 . . . 3) for symbol error analysis, according to an example of the disclosure. The apparatus 100 may include a decoder 110 and a bit error vector (BEV) evaluator block 120. The decoder 110 may include a demultiplexer (demux) 112, a lane alignment, deskew, and reorder circuit (ADR) 114, a FEC block 116, and/or other components. The BEV evaluator block 120 may include a lane alignment and recorder circuit (AR) 124, a symbol error analyzer 126, and/or other components.

The decoder 110, demux 112, lane ADR 114, FEC block 116, BEV evaluator block 120, lane AR 124, symbol error analyzer 126, lane deskew 210, may each be implemented as a semiconductor-based microprocessor, a central processing unit (CPU), an application processor specific integrated circuit (ASIC), a field-programmable gate array (FPGA), and/or other suitable hardware device. It should be noted that each of these components may be incorporated with other components.

Figure 4A:
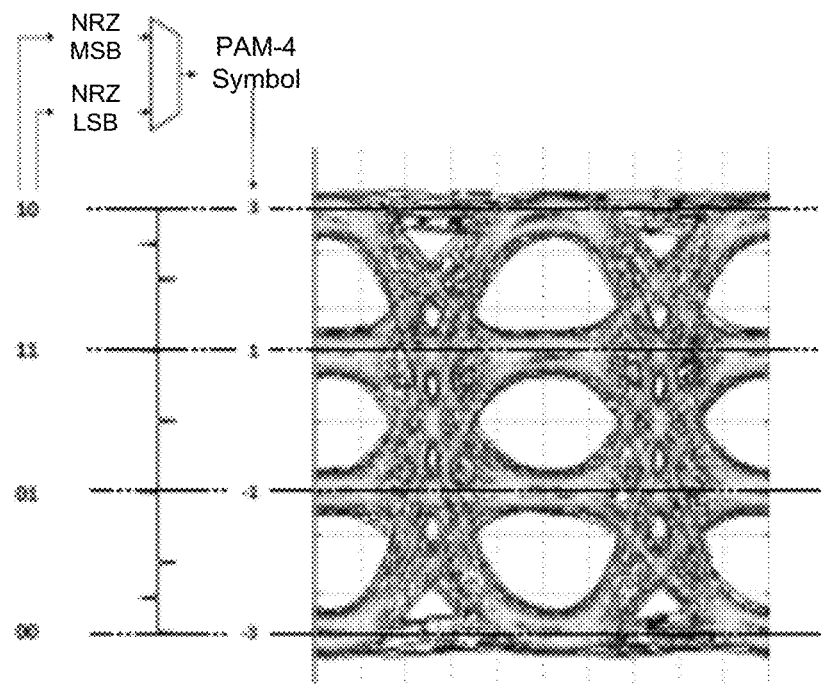
FIG. 4A illustrates an example of non-return-to-zero (NRZ) to PAM-4 symbol mapping with gray encoding, according to an example of the disclosure.
Figure 4B:
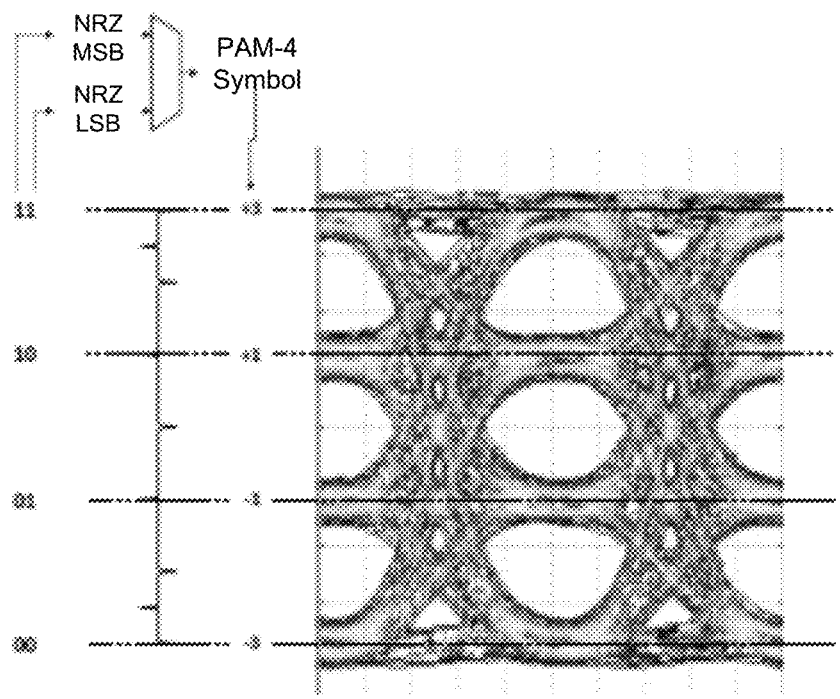
FIG. 4B illustrates an example of NRZ to PAM-4 symbol mapping without gray encoding, according to an example of the disclosure.

The decoder 110 may decode a framed signal 101. In some examples, the decoder 110 may decode the framed signal 101 with FEC in accordance with the Institute of Electrical and Electronics Engineers (IEEE) 802.3cd standard, which is incorporated by reference in its entirety herein. The framed signal 101 may include one or more lanes that each encode symbols. For example, each lane of the framed signal 101 may include a PAM-4 lane that streams encoded PAM-4 symbols, although other types of lanes and symbols may be used. A PAM-4 symbol may be encoded by two bits: a Most Significant Bit (MSB) and a Least Significant Bit (LSB). A PAM-4 symbol error may therefore result from a 1-bit error (MSB or LSB error) or a 2-bit (both MSB and LSB) error. A PAM-4 lane may be associated with two constituent non-return-to-zero (NRZ) lanes. One of the NRZ lanes may encode an MSB and the second NRZ lane may encode a corresponding LSB. Therefore, the MSBs and LSBs of the two NRZ lanes may together encode PAM-4 symbols of a PAM-4 lane. Examples of NRZ to PAM-4 symbol mapping with and without grey encoding are illustrated in FIGS. 4A and 4B.

In some examples, the decoder 110 may correct errors in the framed signal 101 based on processing at the bit level (as opposed to the symbol level) by the FEC block 116. During such correction, the FEC block 116 may generate bit error vectors 117(0 . . . 3) that are used to correct errors at the bit level (such as on bits of the NRZ lanes 0 . . . 3). The BEV evaluator block 120 may access and evaluate the bit error vectors 117(0 . . . 3) to perform symbol error analysis. For example, the BEV evaluator block 120 may map bit errors encoded by the bit error vectors 117(0 . . . 3) to symbols and then analyze symbol-level errors based on such mapping. In this manner, the BEV evaluator block 120 may evaluate bit error vectors resulting from FEC to analyze symbol-level errors.

Having described a high-level overview of the components of apparatus 100, attention will now be turned to various operations of the apparatus 100 that facilitate symbol error analysis.

As previously noted, the framed signal 101 may encode one or more PAM-4 lanes. Because each of the PAM-4 lanes of the framed signal 101 may be encoded by two (or more) NRZ lanes, the demux 112 may decode each lane into corresponding NRZ lanes. In the illustrated example of FIG. 1, the demux 112 may decode a first PAM-4 lane into NRZ lanes NRZ(0) and NRZ(2) and a second PAM-4 lane into NRZ lanes NRZ(1) and NRZ(3). Other types of symbol-based framed signals and other numbers of lanes may be used as well. The demux 112 may forward a first copy of the NRZ lanes(NRZ(0 . . . 3)) for FEC processing by the FEC block 116 (after processing by the lane ADR 114) and a second copy of the NRZ lanes(NRZ(0 . . . 3)) for symbol error analysis by the symbol error analyzer 126 (after processing by the lane AR 124).

The lane ADR 114 may access the NRZ lanes (NRZ(0 . . . 3)) decoded by the demux 112. The lane ADR 114 may perform lane alignment, deskew, and reordering on the NRZ lanes (NRZ(0 . . . 3)). Such alignment, deskew, and reordering may be performed based on the IEEE 802.3cd specification, which is incorporated by reference herein in its entirety.

In some examples, the ADR 114 may perform the lane alignment before the deskew and the reordering, and perform the deskew before the reordering. In some examples, the ADR 114 may perform lane alignment before deskew and reordering, and perform reordering before deskew. Although illustrated as a single component, the ADR 114 may include separate components each performing one or more of the functions of the ADR 114. The lane ADR 114 may forward the aligned, deskewed, and reordered NRZ lanes (NRZ(0 . . . 3)) to the FEC block 116 for error correction.

The FEC block 116 may perform FEC based on codewords encoded in the framed signal 101. FEC is a type of error correction technique that may involve encoding a message in a redundant way at a transmitter and reconstructing errant bits at a receiver without the need for retransmission. For example, the transmitter may add check bits to an outgoing data stream. Adding more check bits may reduce the amount of available bandwidth by increasing the overall block size of the outgoing data, but also may enable the receiver to correct more errors without receiving any retransmission of data. The FEC block 116 may use various types of FEC, including Reed-Solomon correction using Reed-Solomon codewords. Other types of forward error correction technique and corresponding codewords may be used instead of or in addition to the Reed-Solomon technique and corresponding codewords.

The FEC block 116 may use the FEC codewords obtained from the NRZ lanes to correct bit errors. As part of its processing, the FEC block 116 may generate bit error vectors 117(0 . . . 3). In some examples, the FEC block 116 may generate a bit error vector 117 for each NRZ lane. In some examples, the FEC block 116 may generate a bit error vector for more than one NRZ lane, such as based on a FEC codeword that encompasses more than one (and in some examples all) NRZ lanes.

In some examples, a bit error vector 117 may include bit fields. A bit field may include a bit field of the same size as the data to be corrected. If a bit in the field is set to 0, the corresponding incoming data bit is correct. If a bit in the field is set to 1, the corresponding bit in the incoming data is incorrect. Thus, there may be a one-to-one correspondence between the error vector and the data to be corrected. For example, bit number N in the vector may correspond to bit number N of the incoming data. In these examples, the FEC block 116 may perform bit error correction based on a bitwise "Exclusive or" (XOR) operation on the income (lane) data and the corresponding bit error vector.

In some examples, the bit error vector 117 may not be implemented as bit fields. In these examples, the bit error vector 117 may include a list of bit errors where each list entry contains the offset of an incorrect bit. The incoming data may be corrected by locating the errant bits (using the offsets) and inverting these bits.

In some examples, the FEC block 116 may use multi-step forward error correction. In these examples, the FEC block 116 may interleave the output of the multi-step forward correction based on an interleaving schema and the bit error vectors 117 may each be generated according to the interleaving schema. In case of an interleaved FEC, the error vectors are interleaved before applying them to the incoming (lane) data. The interleaving may be performed in the same fashion in which the incoming data is interleaved. For example, if the FEC is interleaved on the basis of 10 bit symbols, the interleaving may be performed in 10 bit data chunks.

The BEV evaluator block 120 may use the NRZ lanes (NRZ(0)-(3)) decoded by the demux 112 and the bit error vectors 117(0 . . . 3) generated by the FEC block 116 to perform symbol error analysis. For example, the lane AR 124 may perform lane alignment and may optionally perform lane reordering on the NRZ lanes. Such alignment and reordering (if reordering is performed) may be performed by the lane AR 124 in a manner similar to the lane ADR 114, but without deskewing. The BEV evaluator block 120 may omit such deskewing to reconstruct the symbol data as it existed on the framed signal 101. In other words, the BEV evaluator block 120 may omit such deskewing to preserve the relative phases of the NRZ lanes as they existed on the framed signal 101.

The symbol error analyzer 126 may access the aligned (and in some examples reordered) NRZ lanes processed by the lane AR 124. The symbol error analyzer 126 may ensure that the NRZ lanes and the bit error vectors are in the correct phase with respect to one another. For example, the symbol error analyzer 126 may apply the bit error vectors 117 generated by the FEC block 116 using alignment marker positions of the NRZ lanes as a phase reference.

The symbol error analyzer 126 may then perform symbol error analysis. For example, the symbol error analyzer 126 may calculate an expected value of data in a given NRZ lane by applying a bit error vector 117 to the given NRZ lane to which the bit error vector 117 relates. For example, the symbol error analyzer 126 may calculate an expected MSB value in a given NRZ lane including MSBs and an expected LSB value in another NRZ lane including LSBs. A deviation from an expected value of a given bit may indicate that an error occurred at—and the FEC block 116 corrected—that bit. This is because the symbol error analyzer 126 analyzes NRZ lane data (illustrated at BEV evaluator block 120) that has not been corrected by the FEC block 116 and applies the bit error vector 117 (derived from forward error correction on duplicate or otherwise forwarded NRZ lane data illustrated at decoder 110) to the NRZ lane data to identify the bit errors. As such, the expected value of a bit that has been corrected may be different than the bit in the (non-corrected) NRZ lane analyzed by the symbol error analyzer 126. The symbol error analyzer 126 may therefore detect bit errors that occurred in an NRZ lane by evaluating a bit error vector 117 output by the FEC block 116.

In a particular example, the symbol error analyzer 126 may compare the MSB values actually received in an NRZ lane with the expected MSB values calculated based on the bit error vector 117. Likewise, the symbol error analyzer 126 may compare the LSB values received in an NRZ lane with the expected LSB values calculated based on the bit error vector 117. Thus, the symbol error analyzer 126 may detect bit errors (e.g., MSB and/or an LSB errors).

The symbol error analyzer 126 may identify the occurrence and location of the detected bit errors that occurred in NRZ lanes. The symbol error analyzer 126 may map the bit errors to corresponding symbols on a PAM-4 or other type of symbol-based lane. For example, the symbol error analyzer 126 may identify the bit errors in each NRZ lane to a corresponding PAM-4 lane and a corresponding PAM-4 symbol. Such bit error mapping is described in more detail with respect to FIG. 3.

Based on the bit error mapping, the symbol error analyzer 126 may identify symbol errors that occurred—which may include errors that were corrected by FEC processing—on the PAM-4 or other symbol-based lane. The symbol error analyzer 126 may generate symbol error information (info.) 129 based on the analysis of the bit errors and identification of the symbol errors.

The symbol error information 129 may include, without limitation, a total number of symbol errors in a PAM-4 lane, a symbol error rate (based on the total number of symbol errors and total symbols received), a symbol error type distribution, symbol burst error parameters (such as average burst size, burst rate, burst size distribution, symbol error distribution within bursts, etc.), symbol error capture, a symbol error type map, a symbol error map, and/or other symbol errors. Further examples of symbol error information 129 will be described with reference to FIGS. 5 and 6.

It should be noted that in examples in which the FEC block 116 interleaved output of multiple forward error correction operations, the symbol error analyzer 126 may map data in the interleaved bit error vector 117 to each NRZ lane according to the interleaving schema used by the FEC block 116 (which is known by the FEC block 116).

Figure 2:
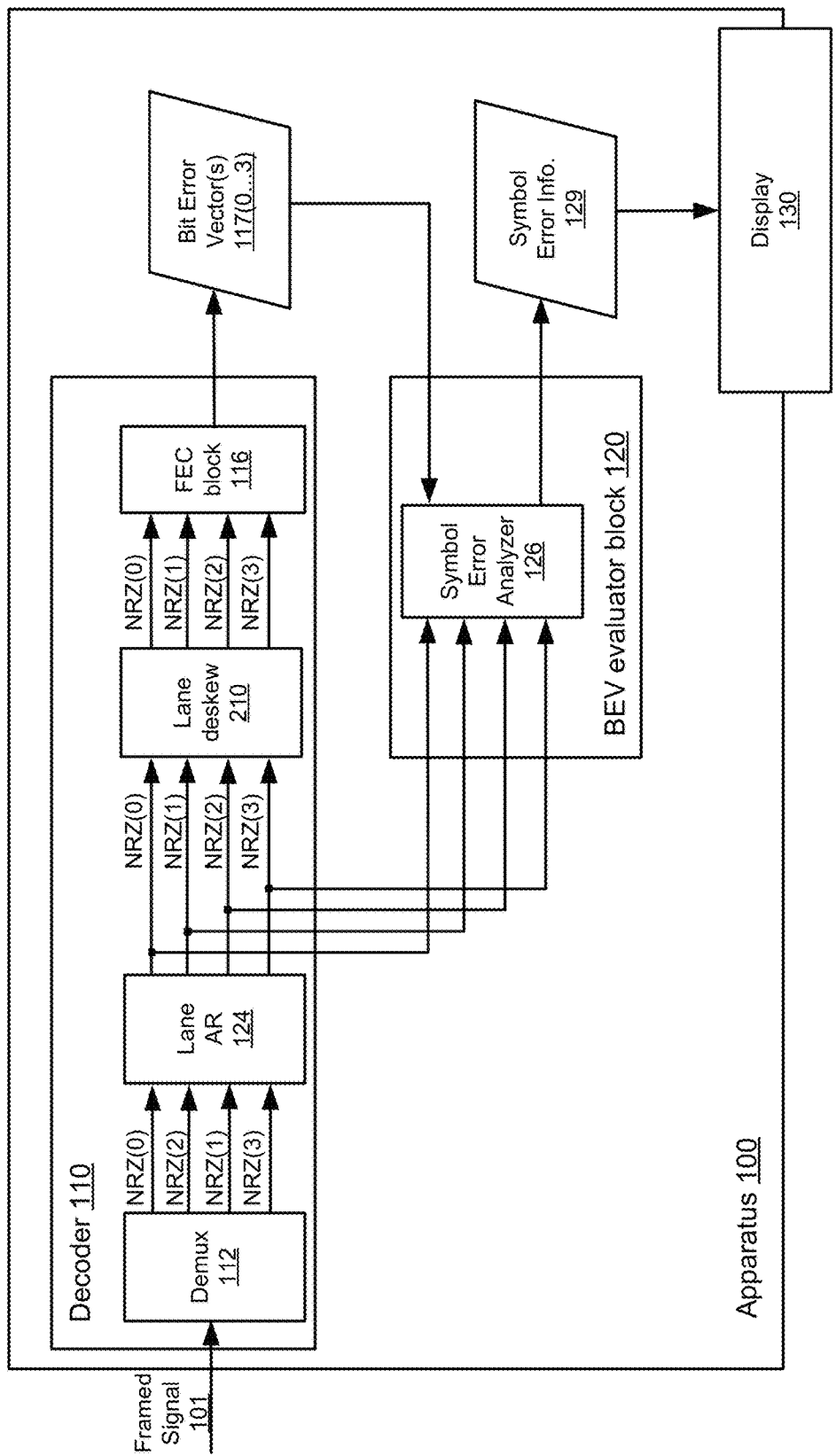
FIG. 2 illustrates another example apparatus for evaluating FEC bit error vectors for symbol error analysis, according to an example of the disclosure.

FIG. 2 illustrates another example apparatus 100 for evaluating FEC bit error vectors for symbol error analysis. The apparatus 100 illustrated in FIG. 2 may function in the same manner as the apparatus 100 illustrated in FIG. 1, with the exceptions noted below. As illustrated in FIG. 2, the BEV evaluator block 120 and the decoder 110 may share lane alignment and reordering. As such, the BEV evaluator block 120 may access NRZ lanes (NRZ(0 . . . 3)) from the shared lane AR 124 instead of from the demux 112 illustrated in FIG. 1. As also illustrated in FIG. 2, the decoder 110 may deskew the NRZ lanes (NRZ(0 . . . 3)) after lane alignment and reordering so that the NRZ lanes (NRZ(0 . . . 3)) duplicated or otherwise forwarded to the BEV evaluator block 120 are not deskewed but the NRZ lanes (NRZ(0 . . . 3)) for the FEC block 116 are deskewed.

Figure 3:
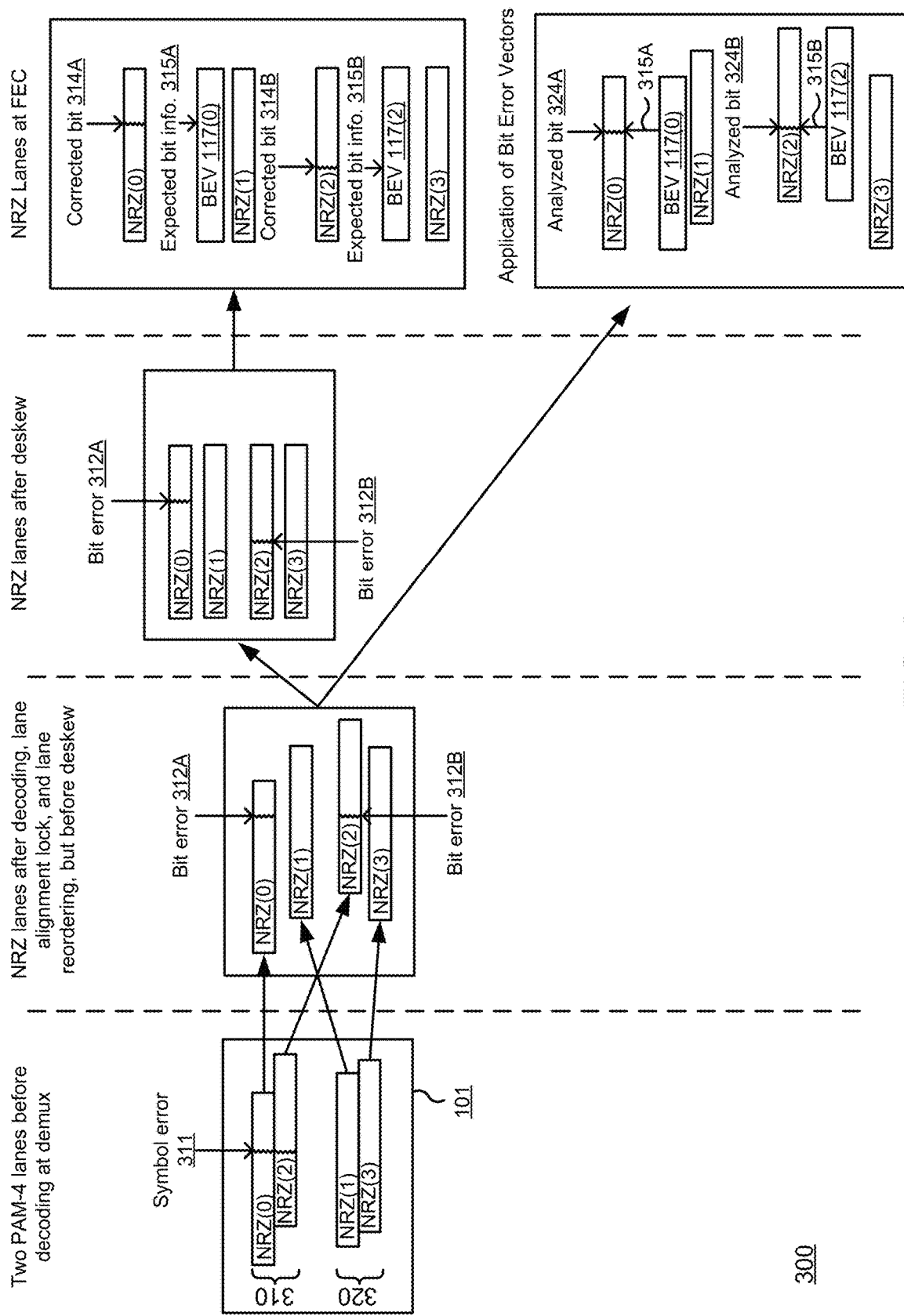
FIG. 3 illustrates an example lane processing schema for evaluating FEC bit error vectors, according to an example of the disclosure.

FIG. 3 illustrates an example lane processing schema 300 for evaluating FEC bit error vectors 117, according to an example of the disclosure. FIG. 3 will be described with reference to FIGS. 1 and 2. As illustrated, the framed signal 101 may include a PAM-4 lane 310 and a PAM-4 lane 320. PAM-4 lane 310 may be encoded by NRZ lanes NRZ(0) and NRZ(2). NRZ(0) may carry LSBs of the PAM-4 lane 310 while NRZ(2) may carry corresponding MSBs of the PAM-4 lane 310. Similarly, PAM-4 lane 320 may be encoded by NRZ lanes NRZ(1) and NRZ(3). NRZ(1) may carry LSBs of the PAM-4 lane 320 while NRZ(3) may carry corresponding MSBs of the PAM-4 lane 320. A symbol error 311 in PAM-4 lane 310 is shown to illustrate underlying bit error mapping from the NRZ lanes (NRZ(0) and NRZ(2)) to the PAM-4 lane 310. PAM-4 lane 320 is shown without any symbol errors for clarity.

Upon decoding by the demux 112, lane alignment lock and lane reordering may be performed on the NRZ lanes (NRZ(0 . . . 3)). Such lane alignment lock and lane reordering may be performed by the lane ADR 114 and the lane AR 124 according to the example illustrated in FIG. 1. Alternatively, such lane alignment lock and lane reordering may be performed by the lane AR 124 (which may be used by both the decoder 110 and the BEV evaluator block 120) according to the example illustrated in FIG. 2. Each NRZ lane (NRZ(0 . . . 3)) may carry a logical lane number in the overhead. In some examples, during lane reordering, the lane ADR 114 or the lane AR 124 (depending on the particular implementation illustrated in FIGS. 1 and 2) may identify this logical lane number when synchronizing to the lane. The mapping between PAM-4 lanes 310 or 320 and NRZ lanes(NRZ(0 . . . 3)) may be made by tracking this logical lane number.

A bit error 312A at NRZ(0) corresponding to the symbol error 311 of PAM-4 lane 310 is shown to exist. Likewise, a bit error 312B at NRZ(1) corresponding to the symbol error 311 of PAM-4 lane 310 is shown to exist. It should be noted that the symbol error 311 in this example is a 2-bit error. However, the symbol error 311 may be caused by a 1-bit error in which bit error 312A or bit error 312B (but not both) occurs.

For FEC processing, the NRZ lanes (NRZ (0 . . . 3)) may be deskewed. Such deskewing may be performed by the lane ADR 114 according to the example illustrated in FIG. 1. Alternatively, such deskewing may be performed by the lane deskew 210 according to the particular example illustrated in FIG. 2.

Upon FEC processing, the bit error 312A may be corrected to result in a corrected bit 314A. Expected bit information (info.) 315A may be represented in the bit error vector (BEV) 117(0) corresponding to the NRZ lane (NRZ (0)) that was corrected. Likewise, the bit error 312B may be corrected to result in a corrected bit 314B. Expected bit information 315B may be represented in the bit error vector (BEV) 117(2) corresponding to the NRZ lane (NRZ(2)) that was corrected. It should be noted that interleaved bit error vectors may be used as well, in which case the interleaving schema used may be accounted for the expected bit information 315A and 315B.

Upon a separate bit error vector application and evaluation process, which may be after FEC processing and may omit deskewing, the BEV 117(0) and BEV 117(2) may be applied to the corresponding lanes NRZ(0) and NRZ(2). These NRZ lanes (NRZ(0) and (2)) are uncorrected duplicate or otherwise forwarded versions of the NRZ lanes NRZ(0) and NRZ(2) for which FEC processing was conducted. In other words, the NRZ lanes (NRZ(0) and (2)) to which BEV 117(0) and BEV 117(2) are applied represent NRZ lanes as they are received from the framed signal 101 (after lane alignment and reordering).

The BEVs 117 may be applied to each corresponding NRZ lane to identify any bit errors. For example, the symbol error analyzer 126 may apply the BEV 117(0) to the NRZ lane (NRZ(0)) to determine an expected bit at each bit position. In particular, the symbol error analyzer 126 may use the expected bit information 315A to determine an expected bit value for the analyzed bit 324A. Likewise, the symbol error analyzer 126 may use the expected bit information 315B to determine an expected value for the analyzed bit 324B. The symbol error analyzer 126 may similarly analyze each of the bits of each NRZ lane.

The symbol error analyzer 126 may compare each expected bit value with a corresponding received bit. The comparison may include an XOR operation. A difference between the received bit and the expected bit may indicate that a bit error occurred and was corrected by the FEC block 116. For example, the analyzed bit 324A (where the bit error 312A occurred) may be different than the expected bit value at that position. Likewise, the analyzed bit 324B (where the bit error 312B occurred) may be different than the expected bit value at that position. The symbol error analyzer 126 may determine that a bit error occurred at the analyzed bits 324A and 324B.

The symbol error analyzer 126 may map the NRZ lane on which the bit errors occurred with a corresponding PAM-4 lane. For example, the symbol error analyzer 126 may map the analyzed bit 324A (determined to have a bit error based on application of the BEV 117(0)) to the NRZ lane NRZ(0). The symbol error analyzer 126 may map NRZ lane NRZ(0) to PAM-4 lane 310. In some examples, the symbol error analyzer 126 may map bit positions on NRZ lane NRZ(0) to symbol positions on PAM-4 lane 310. The symbol error analyzer 126 may perform similar mapping for other analyzed bits, such as analyzed bit 324B. As such, the symbol error analyzer 126 may identify bit errors that occurred on NRZ lanes based on evaluation of FEC bit error vectors, and map the bit errors to symbol errors on corresponding symbol-encoding lanes such as PAM-4 lanes.

It should be noted that, although not illustrated, the PAM-4 lane 310 may have multiple symbol errors that are each similarly mapped. It should be further noted that the apparatus 100 may process other numbers of PAM-4 lanes as well. For example, the apparatus 100 may split a 100 Gbit/s PAM-4 lane into four 25 Gbit/s NRZ lanes. In this example, two consecutive PAM-4 symbols may be decoded in one operation. As a result, the first NRZ lane may carry the MSB of the first symbol, the second NRZ lane may carry the LSB of the first symbol, the third NRZ lane may carry the MSB of the second symbol and the fourth NRZ lane may carry the LSB of the second symbol. In some examples, in an apparatus implementing a PAM-4 multi-lane interface, all PAM-4 lanes (e.g., two or more PAM-4 lanes) of the multi-lane interface may be decoded into NRZ lanes simultaneously.

FIG. 4A illustrates an example of NRZ to PAM-4 symbol mapping with gray encoding and FIG. 4B illustrates an example of NRZ to PAM-4 symbol mapping without gray encoding. For example, referring to FIG. 4A, an MSB value ("1") and corresponding LSB value ("0") (together, "10") may encode a PAM-4 symbol "3." An MSB value ("1") and corresponding LSB value ("1") (together, "11") may encode a PAM-4 symbol "1." An MSB value ("0") and corresponding LSB value ("1") (together, "01") may encode a PAM-4 symbol "−1." An MSB value ("0") and corresponding LSB value ("0") (together, "00") may encode a PAM-4 symbol "−3." Referring to FIG. 4B, the PAM-4 symbols may be encoded similarly, except that the PAM-4 symbol "+3" may be encoded by 2-digit value of "11" and the PAM-4 symbol "+1" may be encoded by 2-digit value of "10." It should be noted that each PAM-4 symbol may correspond to a voltage level as determined from the MSB and LSB according to PAM-4 signal processing.

Figure 5:
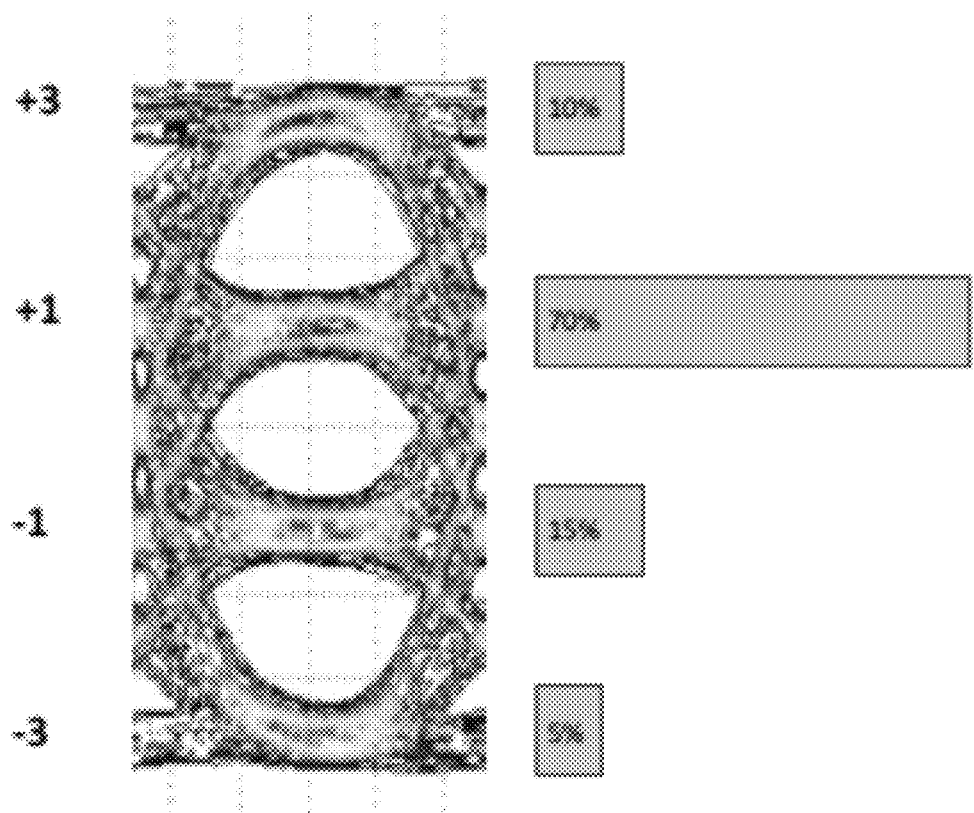
FIG. 5 illustrates an example graphical representation of a symbol error type distribution, according to an example of the disclosure.

FIG. 5 illustrates an example graphical representation 500 of a symbol error type distribution, according to an example of the disclosure. The graphical representation 500 illustrates, for a type of symbol error and its relative frequency compared to other types of symbol errors. For example, as illustrated, four types of symbol errors are graphically represented: an error in which the symbol "−3" was expected but another symbol was received, an error in which the symbol "−1" was expected but another symbol was received, an error in which the symbol "+1" was expected but another symbol was received, and an error in which the symbol "+3" was expected but another symbol was received.

Table 1 below illustrates an example of the symbol error type map that may be generated by the symbol error analyzer 126 and included in the symbol error information 129. The symbol error type map may provide a distribution of symbol error types that are graphically plotted in FIG. 5. It should be noted that the "count" and "percentage" are equal to one another in Table 1 for illustrative convenience, assuming a total count of 100.

| Result Label | Count | Perc. [%] | Description |
|---|---|---|---|
| Relative Symbol −3 error probability | 5 | 5 | Symbol −3 expected but other symbol received (Number of symbol −3 errors/Total number of symbol errors)*100 |
| Relative Symbol −1 error probability | 15 | 15 | Symbol −1 expected but other symbol received (Number of symbol −1 errors/Total number of symbol errors)*100 |
| Relative Symbol +1 error probability | 70 | 70 | Symbol +1 expected but other symbol received (Number of symbol +1 errors/Total number of symbol errors)*100 |
| Relative Symbol +3 error probability | 10 | 10 | Symbol +3 expected but other symbol received (Number of symbol +3 errors/Total number of symbol errors)*100 |

Figure 6:
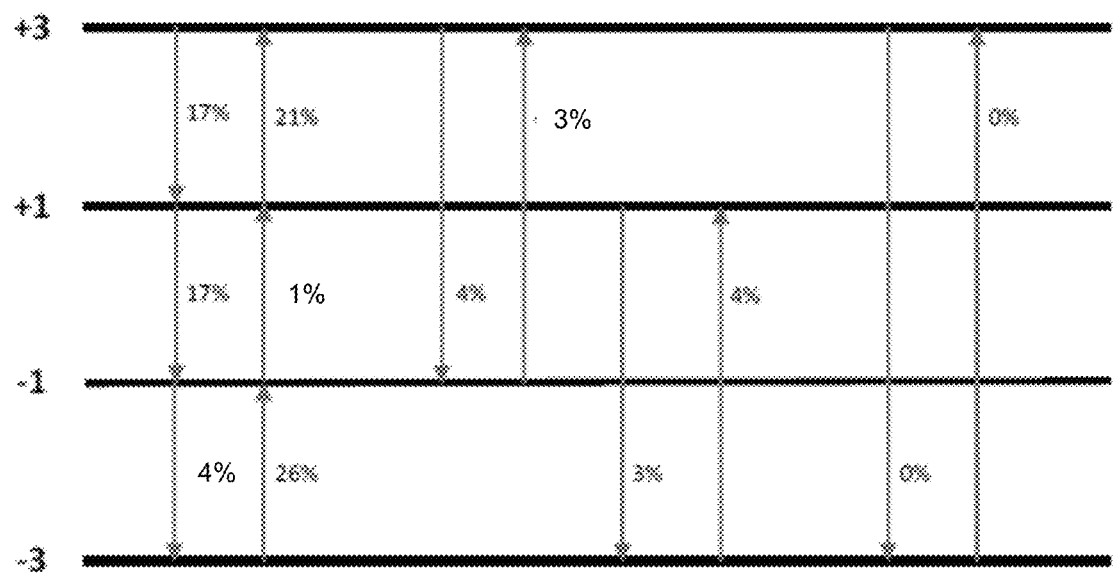
FIG. 6 illustrates an example graphical representation of a symbol error map, according to an example of the disclosure.

FIG. 6 illustrates an example graphical representation 600 of a symbol error map. The symbol error map 600 may show the relative percentage of symbol errors (from an expected symbol to a received (errant) symbol). In some examples, the symbol error map may be used to derive other symbol error information.

Table 2 below illustrates an example of values for the symbol error map 600.

| Rel. Symbol Error Prob. | Symbol Error | Count | Perc. [%] | Description |
|---|---|---|---|---|
| −3 errors | −3 -> −1 | 26 | 26 | Expected symbol −3 but received symbol −1 |
|  | −3 -> +1 | 4 | 4 | Expected symbol −3 but received symbol +1 |
|  | −3 -> +3 | 0 | 0 | Expected symbol −3 but received symbol +3 |
| −1 errors | −1 -> −3 | 4 | 4 | Expected symbol −1 but received symbol −3 |
|  | −1 -> +1 | 1 | 1 | Expected symbol −1 but received symbol +1 |
|  | −1 -> +3 | 3 | 3 | Expected symbol −1 but received symbol +3 |
| +1 errors | +1 -> −3 | 3 | 3 | Expected symbol +1 but received symbol −3 |
|  | +1 -> −1 | 17 | 17 | Expected symbol +1 but received symbol −1 |
|  | +1 -> +3 | 21 | 21 | Expected symbol +1 but received symbol +3 |
| +3 errors | +3 -> −3 | 0 | 0 | Expected symbol +3 but received symbol −3 |
|  | +3 -> −1 | 4 | 4 | Expected symbol +3 but received symbol −1 |
|  | +3 -> +1 | 17 | 17 | Expected symbol +3 but received symbol +1 |

In some examples, the symbol error map may be used to derive other symbol error information 129. In one example, the symbol error map illustrated in FIG. 6 and Table 2 may be used to derive symbol burst errors. The symbol error analyzer 126 may calculate the symbol burst errors based on the symbol error map illustrated in FIG. 6 and Table 2 and symbol burst error parameters.

Table 3 below illustrates an example of burst error parameters used to calculate symbol burst errors.

| Parameter | Range | Default | Comment |
|---|---|---|---|
| Burst separation | 1 . . . 64 | 1 | Number of required error free symbols between bursts (>= Burst separation terminates burst). |
| Minimum burst size | 1 . . . Max_Burst_Size/2 | 2 | Only bursts >= minimum burst size are considered bursts. |

Table 4 below illustrates burst errors that may be calculated.

| Result Label | Count | Perc. [%] | Comment |
|---|---|---|---|
| Burst size distribution: Burst size [PL#][BS] | Y | Y | Histogram: Number of bursts versus burst size BS. BS = 1 .. Max_Burst_Size Percentage[BS] = (Burst Size[PL#][BS]/Number of Bursts) * 100 |

-continued

| Result Label | Count | Perc. [%] | Comment |
|---|---|---|---|
| Number of bursts | Y | — | The (total) number of bursts. $$\left(\sum_{i=Minimum\ Burst\ Size}^{i=Maximum\ Burst\ Size} Burst\ size[i]\right) +$$ Excessive size bursts |
| Excessive size bursts | Y | Y | Bursts > Max_Burst_Size Percentage[BS] = (Excessive Size Bursts/Number of Bursts) * 100 |
| Symbol error distribution: Symbol error [PL#][BS] | Y | Y | Histogram: Number of symbol errors versus BS. BS = 1 .. Max_Burst_Size Percentage[BS] = (Symbol error[PL#][BS]/Total number of symbol errors) * 100 |
| Excessive size bursts symbol errors | Y | Y | The total number of symbol errors in excessive size bursts. Percentage = (Excessive size bursts symbol errors/Total symbol errors) * 100 |
| Number of symbol errors in bursts | Y | — | The total number of symbol errors in bursts. Symbol errors in excessive size bursts are included. $$\sum_{i=Minimum\ Burst\ Size}^{i=Maximum\ Burst\ Size} Symbol\ error[i]) +$$ Excessive size bursts symbol error |
| Symbol error burstiness | — | Y | $$Burstiness = \frac{Number\ of\ symbol\ errors\ in\ bursts}{Total\ number\ of\ symbol\ errors} * 100$$ |

Figure 7:
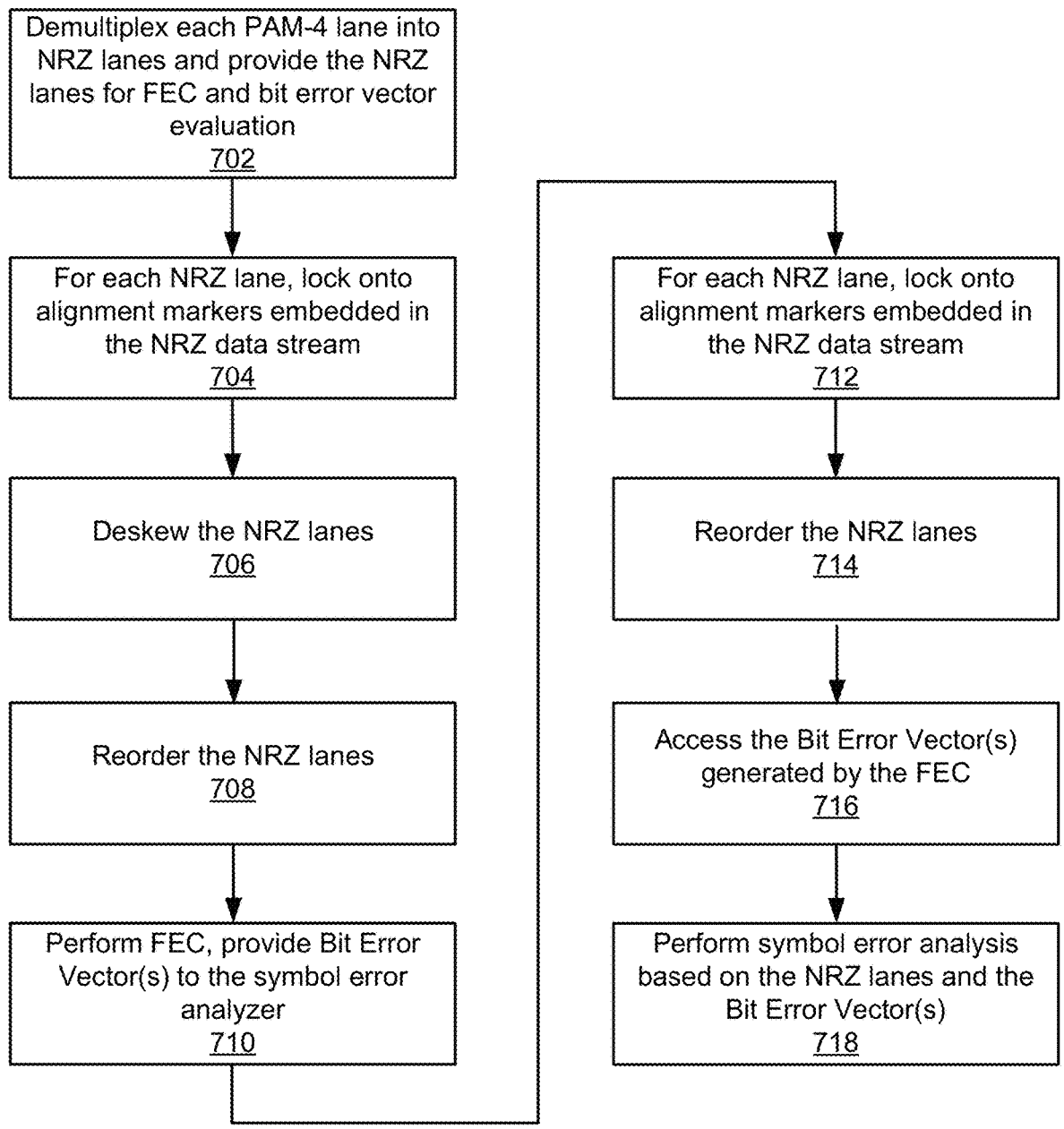
FIG. 7 illustrates an example method of evaluating FEC bit error vectors for symbol error analysis, according to an example of the disclosure.

FIG. 7 illustrates an example method 700 of evaluating FEC bit error vectors for symbol error analysis, according to an example of the disclosure. Although the method 700 is primarily described as being performed by apparatus 100 as shown in FIG. 1 or 2, the method 700 may be executed or otherwise performed by other systems, or a combination of systems. Each block shown in FIG. 7 may further represent one or more processes, methods, or subroutines, and one or more of the blocks may include machine-readable instructions stored on a non-transitory computer readable medium and executed by a processor or other type of processing circuit to perform one or more operations described herein.

At block 702, the demux 112 may demultiplex each PAM-4 lane into NRZ lanes and forward the NRZ lanes for FEC and bit error vector evaluation. For example, the NRZ lanes may be duplicated, forwarded, or otherwise provided to the lane ADR 114 for processing the NRZ lanes for forward error correction. The NRZ lanes may separately be provided to the BEV evaluator block 120 for bit error vector evaluation.

At block 704, the lane ADR 114 may, for each NRZ lane, lock onto alignment markers embedded in the NRZ data stream. At block 706, the lane ADR 114 may deskew each of the NRZ lanes. At block 708, the lane ADR 114 may reorder the NRZ lanes.

At block 710, the FEC block 116 may perform forward error correction. In the process of performing forward error correction, the FEC block 116 may generate a bit error vector 117. In some instances, the FEC block 116 may generate a bit error vector 117 for each NRZ lane. The bit error vector 117 may be used to identify bit errors. The bit error vector(s) 117 may be provided to the symbol error analyzer 126 for evaluation.

At block 712, the lane AR 124 may, for each NRZ lane, lock onto alignment markers embedded in the NRZ data stream. It should be noted that block 712 may be performed in a manner similar to block 704, except that the lane AR 124 may lock onto alignment markers of each of its copy of the NRZ lanes, while the lane ADR 114 may lock onto alignment markers of each of its copy of the NRZ lanes.

At block 714, the lane AR 124 may reorder the NRZ lanes. It should be noted that block 714 may be performed in a manner similar to block 706, except that the lane AR 124 may reorder its copy of the NRZ lanes, while the lane ADR 114 may reorder its copy of the NRZ lanes.

At block 716, the symbol error analyzer 126 may access the bit error vector(s) 117 determined at the FEC block 116.

At block 718, the symbol error analyzer 126 may perform symbol error analysis based on the NRZ lanes from the lane AR 124 and the bit error vector(s) 117. For example, the symbol error analyzer 126 may, for each NRZ lane, determine an expected bit based on the bit error vector 117 and compare the expected bit to a corresponding received bit (based on phase reference) on the NRZ lane. A mismatch may indicate a bit error. If such bit error is determined the NRZ lane, the symbol error analyzer 126 may map the NRZ lane to a corresponding PAM-4 lane and map the bit position on the NRZ lane at which the bit error occurred to a symbol on the PAM-4 lane. As such, the symbol error analyzer 126 may identify symbol errors on the PAM-4 lane. The symbol error analyzer 126 may analyze (such as count or otherwise quantify) the symbol errors to generate symbol error information 129, which may be displayed via a display 130.

Figure 8:
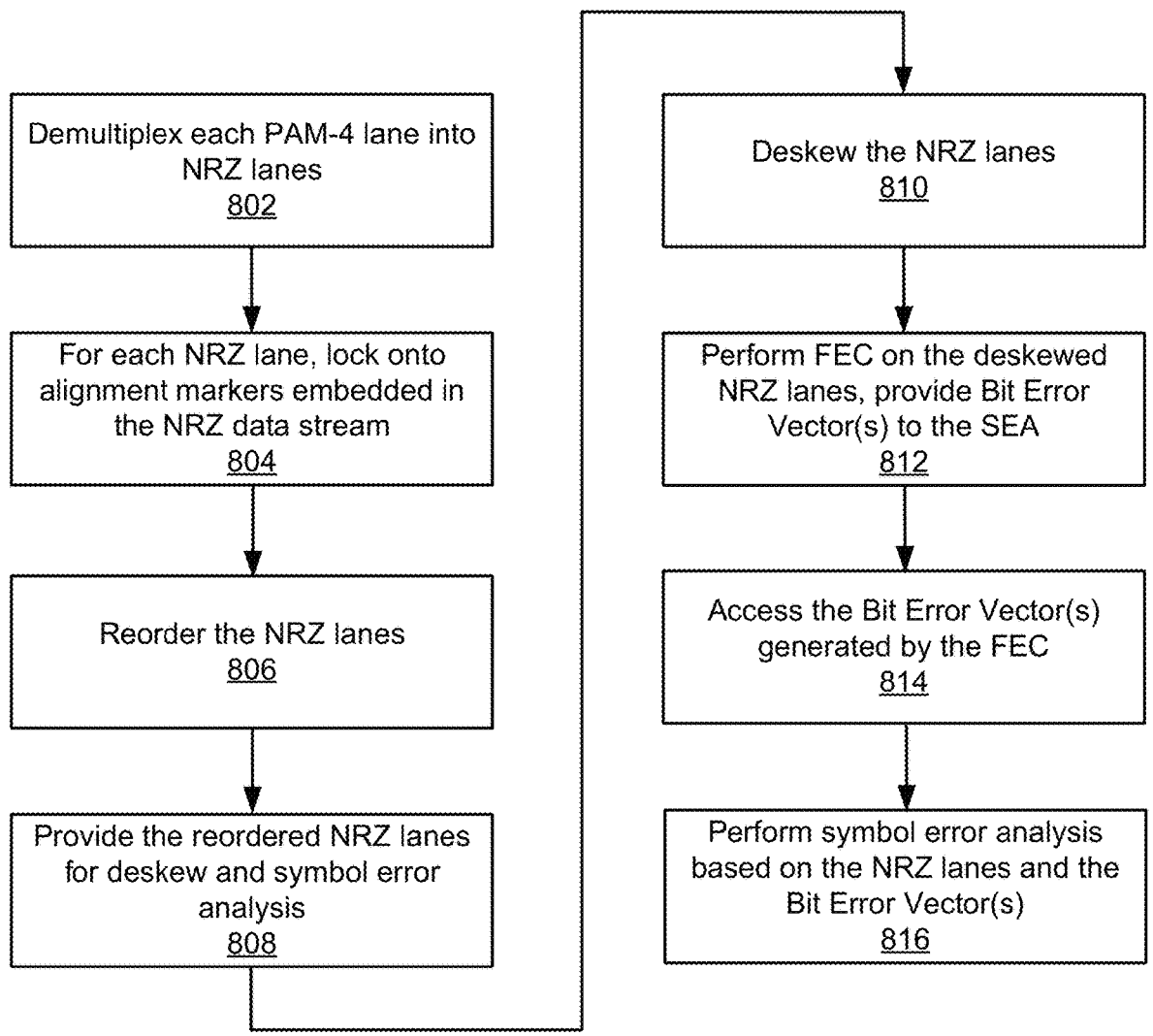
FIG. 8 illustrates another example method of evaluating FEC bit error vectors for symbol error analysis, according to an example of the disclosure.

FIG. 8 illustrates another example method 800 of evaluating FEC bit error vectors for symbol error analysis, according to an example of the disclosure. Although the method 800 is primarily described as being performed by apparatus 100 as shown in FIG. 1 or 2, the method 800 may be executed or otherwise performed by other systems, or a combination of systems. Each block shown in FIG. 8 may further represent one or more processes, methods, or subroutines, and one or more of the blocks may include machine-readable instructions stored on a non-transitory computer readable medium and executed by a processor or other type of processing circuit to perform one or more operations described herein.

At block 802, the demux 112 may demultiplex each PAM-4 lane into NRZ lanes. At block 804, the lane AR 124 may, for each NRZ lane, lock onto alignment markers embedded in the NRZ data stream. At block 806, the lane AR 124 may reorder the NRZ lanes. At block 808, the lane AR 124 may provide the aligned and reordered NRZ lanes for deskew and symbol error analysis. For example, the aligned and reordered NRZ lanes may be duplicated, forwarded, or otherwise provided to the lane deskew 210 for deskewing for forward error correction. The NRZ lanes may separately be provided to the BEV evaluator block 120 for bit error vector evaluation.

At block 810, the lane deskew 210 may deskew the NRZ lanes. At block 812, the FEC block 116 may perform forward error correction. In the process of performing forward error correction, the FEC block 116 may generate a bit error vector 117. In some instances, the FEC block 116 may generate a bit error vector 117 for each NRZ lane. The bit error vector(s) 117 may be used to identify bit errors. The bit error vector(s) 117 may be provided to the symbol error analyzer 126 for evaluation.

At block 814, the symbol error analyzer 126 may access the bit error vector(s) 117 determined at the FEC block 116. At block 816, the symbol error analyzer 126 may perform symbol error analysis based on the NRZ lanes from the lane AR 124 and the bit error vector(s) 117. The symbol error analysis may be similar to the analysis described at block 718 illustrated in FIG. 7.

FIG. 9 illustrates an example method 900 of evaluating FEC bit error vectors for symbol error analysis, according to an example of the disclosure. Although the method 900 is primarily described as being performed by apparatus 100 as shown in FIG. 1 or 2, the method 900 may be executed or otherwise performed by other systems, or a combination of systems. Each block shown in FIG. 9 may further represent one or more processes, methods, or subroutines, and one or more of the blocks may include machine-readable instructions stored on a non-transitory computer readable medium and executed by a processor or other type of processing circuit to perform one or more operations described herein.

At block 902, the decoder 110 may demultiplex a 4-level pulse amplitude modulation (PAM-4) lane into at least two non-return-to-zero (NRZ) lanes, wherein each NRZ lane, of the at least two NRZ lanes, encodes a bit that, together with another bit of another NRZ lane, encodes a corresponding symbol on the PAM-4 lane. Block 902 may further include operations that may include one or more of operations 702-708 illustrated in FIG. 7 or one or more of operations 802-812 illustrated in FIG. 8. In some examples, the decoder 110 may perform some or all of the decoding on a first copy of the at least two NRZ lanes. In some examples, the decoder 110 may receive a framed signal 101 comprising the PAM-4 lane and at least a second PAM-4 lane. The second PAM-4 lane may be processed in a manner similar to the PAM-4 lane for symbol error analysis. In some examples, the second PAM-4 lane (and/or other PAM-4 lanes included in the framed signal 101) may be processed together with the PAM-4 lane for symbol error analysis.

For example, as illustrated in FIG. 1, the decoder 110 may perform lane alignment, deskew, and reordering on the first copy, and may forwarded a second copy of the at least two NRZ lanes to the BEV evaluator block 120 (in which the second copy has not been aligned, deskewed, or reordered) for lane alignment and reordering, and then symbol error analysis. In another example, as illustrated in FIG. 2, the decoder 110 may perform alignment and reordering on the first copy, and may forwarded (provide) a second copy of the aligned and reordered at least two NRZ lanes to the symbol error analyzer 126 before a deskew of the aligned and reordered at least two NRZ lanes. The decoder 110 may then perform a deskew on the first copy.

At block 904, the decoder 110 may perform forward error correction on the at least two NRZ lanes to correct bit errors that occurred on the at least two NRZ lanes, wherein each bit error on an NRZ lane contributes to a corresponding symbol error of the PAM-4 lane. In some examples, the decoder 110 may perform forward error correction on the first copy of the at least two NRZ lanes.

At block 906, the decoder 110 may generate a bit error vector based on the forward error correction. In some examples, the bit error vector comprises a plurality of bit error vectors (e.g., at least a first bit error vector and a second bit error vector) each corresponding to a respective one of the at least two NRZ lanes. In some examples, the bit error vector comprises a single bit error vector that corresponds to the at least two NRZ lanes.

At block 908, the BEV evaluator block 120 may include a symbol error analyzer 126 that may access the bit error vector. In some examples, the symbol error analyzer 126 may operate on the second copy of the at least two NRZ lanes. The second copy may not be deskewed (thereby omitting deskew from processing) to preserve the phase of each of the second copy of the at least two NRZ lanes.

At block 910, the symbol error analyzer 126 may identify the bit errors based on the bit error vector. For example, the symbol error analyzer 126 may apply the bit error vector to the second copy of the at least two NRZ lanes, determine, for each NRZ lane of the second copy of the at least two NRZ lanes, an expected bit on the NRZ lane based on application of the bit error vector, compare the expected bit to a corresponding bit received on the NRZ lane, determine that the corresponding bit does not match the expected bit, wherein a non-match indicates an error at the corresponding bit. For example, the symbol error analyzer may identify a bit error for any received bit on an NRZ lane that does not match the corresponding expected bit, which is a bit that is expected at a bit position of the received bit.

At block 912, the symbol error analyzer 126 may map the bit errors to respective symbols on the PAM-4 lane. For example, the symbol error analyzer 126 may identify an NRZ lane of the at least two NRZ lanes that includes the bit error, identify the PAM-4 lane that is encoded by the NRZ lane, and determine a symbol position on the PAM-4 lane corresponding to a bit position of the bit error on the NRZ lane. In some examples, a first NRZ lane of the at least two NRZ lanes that encodes a first most significant bit (MSB) of a symbol and a second NRZ lane of the at least two NRZ lanes encodes a first least significant bit (LSB) of the symbol, and wherein the symbol error analyzer is to map an error at the first MSB, the first LSB, or both the first MSB and the first LSB to the symbol.

At block 914, the symbol error analyzer 126 may generate symbol error information based on the mapped bit errors. In some examples, the symbol error information may be used to tune one or more parameters for transmitting the framed signal. For example, the one or more parameters may include signal level, pre-emphasis, and amplitude linearity. If a predominant number of errors are symbol −1 and/or symbol +1 errors, the opening to the inner eye of an eye map (examples of which are illustrated in FIGS. 4A and 4B) should be made larger by tuning the one or more parameters.

Figure 10:
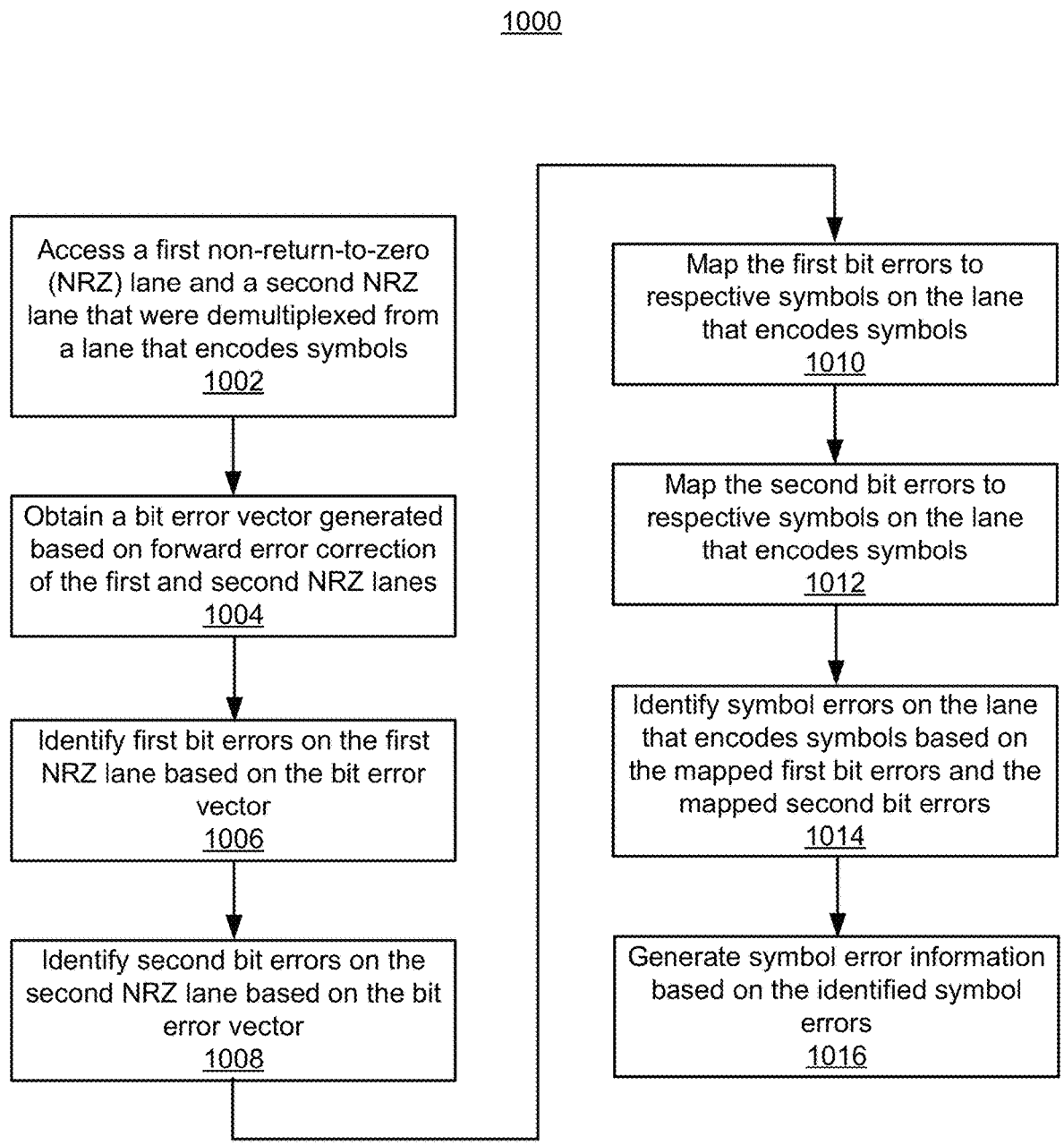
FIG. 10 illustrates another example method of evaluating FEC bit error vectors for symbol error analysis, according to an example of the disclosure.

FIG. 10 illustrates another example method 1000 of evaluating FEC bit error vectors for symbol error analysis, according to an example of the disclosure. Although the method 1000 is primarily described as being performed by apparatus 100 as shown in FIG. 1 or 2, the method 1000 may be executed or otherwise performed by other systems, or a combination of systems. Each block shown in FIG. 10 may further represent one or more processes, methods, or subroutines, and one or more of the blocks may include machine-readable instructions stored on a non-transitory computer readable medium and executed by a processor or other type of processing circuit to perform one or more operations described herein.

At block 1002, a symbol error analyzer 126 may access a first non-return-to-zero (NRZ) lane and a second NRZ lane that were demultiplexed from a 4-level pulse amplitude modulation (PAM-4) lane. At block 1004, the symbol error analyzer 126 may obtain a bit error vector generated based on forward error correction of the first NRZ lane and the second NRZ lane. In some examples, the forward error correction may include a plurality of forward error corrections that are processed based on an interleaving schema. In these examples, the bit error vector is applied based on the interleaving schema.

At block 1006, the symbol error analyzer 126 may identify first bit errors on the first NRZ lane based on the bit error vector. At block 1008, the symbol error analyzer 126 may identify second bit errors on the second NRZ lane based on the bit error vector.

At block 1010, the symbol error analyzer 126 may map the first bit errors to respective symbols on the PAM-4 lane. At block 1012, the symbol error analyzer 126 may map the second bit errors to respective symbols on the PAM-4 lane. In some examples, a first bit error of the first bit errors and a second bit error of the second bit errors may both map to a single symbol of the PAM-4 lane such that the single symbol as received at the apparatus included a 2-bit error. In some examples, a first bit error of the first bit errors may map to a first symbol of the PAM-4 lane such that the first symbol as received at the apparatus 100 included a 1-bit error (in other words, no other bit errors were identified for the first symbol).

At block 1014, the symbol error analyzer 126 may identify symbol errors on the PAM-4 lane based on the mapped first bit errors and the mapped second bit errors. At block 1016, the symbol error analyzer 126 may generate symbol error information based on the identified symbol errors.

Figure 11:
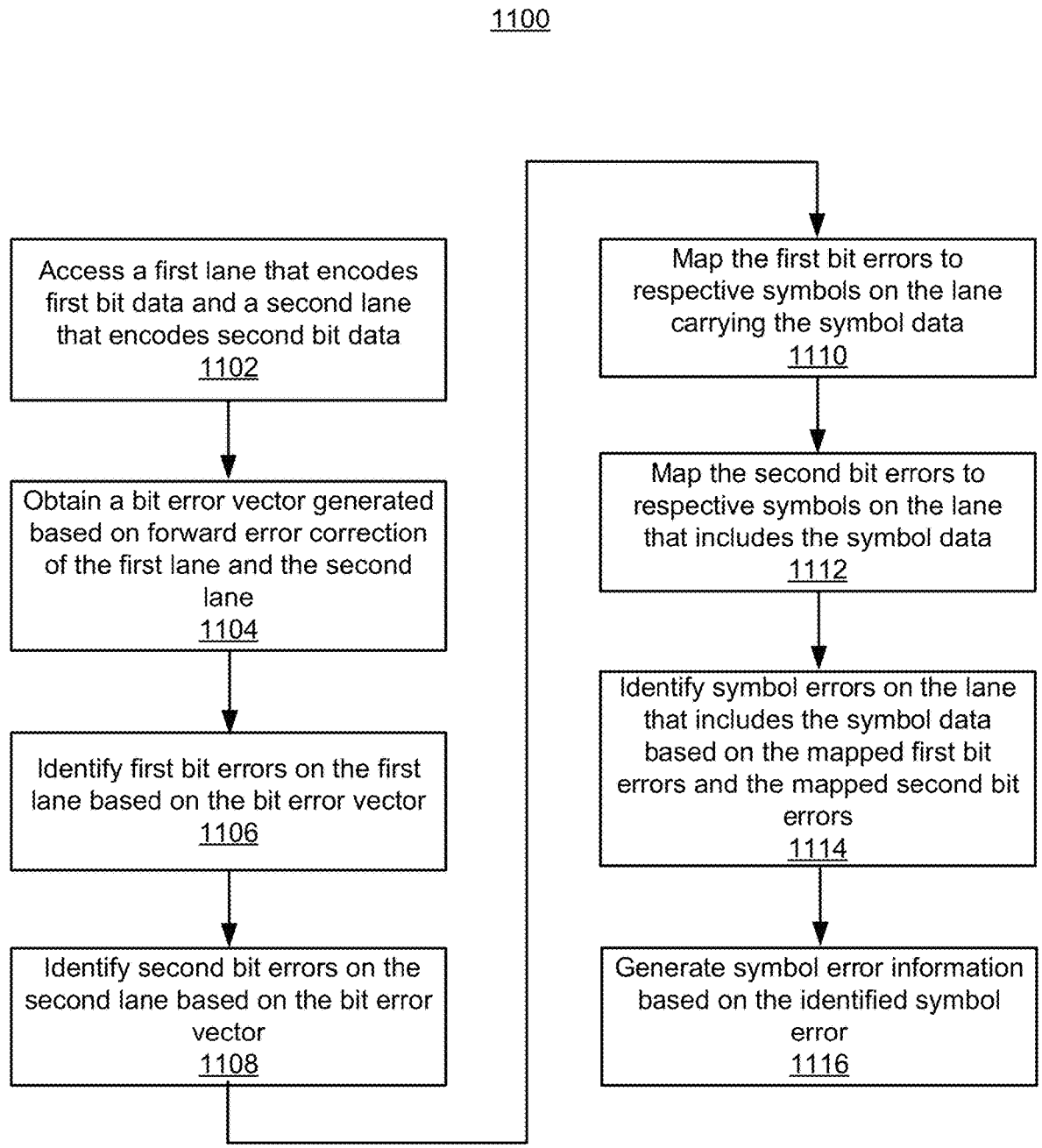
FIG. 11 illustrates another example method of evaluating FEC bit error vectors for symbol error analysis, according to an example of the disclosure.

FIG. 11 illustrates another example method 1100 of evaluating FEC bit error vectors for symbol error analysis, according to an example of the disclosure. Although the method 1100 is primarily described as being performed by apparatus 100 as shown in FIG. 1 or 2, the method 1000 may be executed or otherwise performed by other systems, or a combination of systems. Each block shown in FIG. 11 may further represent one or more processes, methods, or subroutines, and one or more of the blocks may include machine-readable instructions stored on a non-transitory computer readable medium and executed by a processor or other type of processing circuit to perform one or more operations described herein.

At block 1102, a symbol error analyzer 126 may access a first lane that encodes first bit data and a second lane that encodes second bit data, wherein the first lane and the second lane were demultiplexed from a lane including symbol data, and wherein the first bit data and the second bit data together encode the symbol data. In some examples, the method 1100 may include preserving a first reference phase of the first lane and a second reference phase of the second lane by omitting a deskew on the first lane and the second lane.

At block 1104, the symbol error analyzer 126 may obtain a bit error vector generated based on forward error correction of the first lane and the second lane. At block 1106, the symbol error analyzer 126 may identify first bit errors on the first lane based on the bit error vector. At block 1108, the symbol error analyzer 126 may identify second bit errors on the second lane based on the bit error vector.

At block 1110, the symbol error analyzer 126 may map the first bit errors to respective symbols on the lane that includes the symbol data. At block 1112, the symbol error analyzer 126 may map the second bit errors to respective symbols on the lane that includes the symbol data. At block 1114, the symbol error analyzer 126 may identify symbol errors on the lane that includes the symbol data based on the mapped first bit errors and the mapped second bit errors. At block 1116, the symbol error analyzer 126 may generate symbol error information based on the identified symbol errors.

FIGS. 1 and 2 represent simplified block diagrams showing only the blocks relevant for the methods of the present disclosure. Block elements not relevant for the methods of this disclosure are not shown, including but not limited to functional elements such as alignment removers, receive (Rx) scramblers, transcoders, block distribution, etc.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. An apparatus for symbol error analysis based on bit error vector evaluation, comprising:
    a decoder to:
        demultiplex a 4-level pulse amplitude modulation (PAM-4) lane into at least two non-return-to-zero (NRZ) lanes, wherein each NRZ lane, of the at least two NRZ lanes, encodes a bit that, together with another bit of another NRZ lane, encodes a corresponding symbol on the PAM-4 lane;
        perform forward error correction on the at least two NRZ lanes to correct bit errors that occurred on the at least two NRZ lanes, wherein each bit error on an NRZ lane contributes to a corresponding symbol error of the PAM-4 lane; and
        generate a bit error vector based on the forward error correction; and
    a bit error vector evaluator block comprising a symbol error analyzer to:
        access the bit error vector;
        identify bit errors based on the bit error vector;
        map the bit errors to respective symbols on the PAM-4 lane; and
        generate symbol error information based on the mapped bit errors.

2. The apparatus of claim 1, wherein to map the bit errors to the respective symbols, the symbol error analyzer is to, for each bit error of the bit errors:
    identify an NRZ lane of the at least two NRZ lanes that includes the bit error; and
    identify the PAM-4 lane that is encoded by the NRZ lane; and
    determine a symbol position on the PAM-4 lane corresponding to a bit position of the bit error on the NRZ lane.

3. The apparatus of claim 1, wherein the decoder is to operate a first copy of the at least two NRZ lanes and the symbol error analyzer is to operate on a second copy of the at least two NRZ lanes.

4. The apparatus of claim 3, wherein to identify the bit errors based on the bit error vector, the symbol error analyzer is to:
apply the bit error vector to the second copy of the at least two NRZ lanes;
determine, for each NRZ lane of the second copy of the at least two NRZ lanes, an expected bit on the NRZ lane based on application of the bit error vector;
compare the expected bit to a corresponding bit received on the NRZ lane; and
determine that the corresponding bit does not match the expected bit, wherein a non-match indicates an error at the corresponding bit.

5. The apparatus of claim 3, wherein the decoder is to:
lock onto alignment markers of each of the first copy of the at least two NRZ lanes; and
perform deskew on each of the first copy of the at least two NRZ lanes;
wherein the bit error vector evaluator block comprises a lane alignment and reordering circuit to:
lock onto alignment markers of each of the second copy of the at least two NRZ lanes; and
omit deskew on the second copy of the at least two NRZ lanes to preserve the phase of each of the second copy of the at least two NRZ lanes.

6. The apparatus of claim 3, wherein the decoder is to:
lock onto alignment markers of each of the first copy of the at least two NRZ lanes to align the first copy of the at least two NRZ lanes;
provide the aligned first copy of the at least two NRZ lanes to the symbol error analyzer before a deskew of the aligned first copy of the at least two NRZ lanes;
perform the deskew on each of the aligned first copy of the at least two NRZ lanes after the aligned first copy is provided to the symbol error analyzer; and
wherein the second copy of the at least two NRZ lanes is based on the aligned first copy of the at least two NRZ lanes from the decoder.

7. The apparatus of claim 1, wherein the bit error vector comprises a plurality of bit error vectors each corresponding to a respective one of the at least two NRZ lanes.

8. The apparatus of claim 1, wherein the bit error vector comprises a single bit error vector that corresponds to the at least two NRZ lanes.

9. The apparatus of claim 1, wherein the decoder receives a framed signal comprising the PAM-4 lane and at least a second PAM-4 lane.

10. The apparatus of claim 9, wherein the symbol error information is used to tune one or more parameters for transmitting the framed signal.

11. The apparatus of claim 1, wherein the symbol error information comprises at least one of: a symbol error rate, a symbol error type distribution, a symbol error type map, an average symbol error burst size, a symbol burst error rate, a symbol burst error size distribution, symbol error distribution within bursts, and a symbol error capture.

12. The apparatus of claim 1, wherein a first NRZ lane of the at least two NRZ lanes encodes a first most significant bit (MSB) of a symbol and a second NRZ lane of the at least two NRZ lanes encodes a first least significant bit (LSB) of the symbol, and wherein the symbol error analyzer is to map an error at the first MSB, the first LSB, or both the first MSB and the first LSB to the symbol.

13. An apparatus for symbol error analysis based on bit error vector evaluation, comprising:
a symbol error analyzer to:
access a first non-return-to-zero (NRZ) lane and a second NRZ lane that were demultiplexed from a lane that encodes symbols;
obtain a bit error vector generated based on forward error correction of the first NRZ lane and the second NRZ lane;
identify first bit errors on the first NRZ lane based on the bit error vector;
identify second bit errors on the second NRZ lane based on the bit error vector;
map the first bit errors to respective symbols on the lane that encodes symbols;
map the second bit errors to respective symbols on the lane that encodes symbols;
identify symbol errors on the lane that encodes symbols based on the mapped first bit errors and the mapped second bit errors; and
generate symbol error information based on the identified symbol errors.

14. The apparatus of claim 13, wherein a first bit error of the first bit errors and a second bit error of the second bit errors both map to a single symbol of the lane that encodes symbols such that the single symbol as received at the apparatus included a 2-bit error.

15. The apparatus of claim 13, wherein the forward error correction comprises a plurality of forward error corrections that are processed based on an interleaving schema, and wherein the bit error vector is applied based on the interleaving schema.

16. A method for symbol error analysis based on bit error vector evaluation, comprising
accessing, by a symbol error analyzer, a first lane that encodes first bit data and a second lane that encodes second bit data, wherein the first lane and the second lane were demultiplexed from a lane that includes symbol data, and wherein the first bit data and the second bit data together encode the symbol data;
obtaining, by the symbol error analyzer, a bit error vector generated based on forward error correction of the first lane and the second lane;
identifying, by the symbol error analyzer, first bit errors on the first lane based on the bit error vector;
identifying, by the symbol error analyzer, second bit errors on the second lane based on the bit error vector;
mapping, by the symbol error analyzer, the first bit errors to first respective symbols on the lane that includes the symbol data;
mapping, by the symbol error analyzer, the second bit errors to second respective symbols on the lane that includes the symbol data;
identifying, by the symbol error analyzer, symbol errors on the lane that includes the symbol data based on the mapped first bit errors and the mapped second bit errors; and
generating, by the symbol error analyzer, symbol error information based on the identified symbol errors.

17. The method of claim 16, wherein the bit error vector comprises a single bit error vector to be applied to the first lane and the second lane.

18. The method of claim 16, wherein the bit error vector comprises a first bit error vector to be applied to the first lane and a second bit error vector to be applied to the second lane.

19. The method of claim 16, further comprising:
preserving a first reference phase of the first lane and a second reference phase of the second lane by omitting deskew on the first lane and the second lane.

20. The method of claim 16, wherein identifying the first bit errors comprises:
applying the bit error vector to the first lane;
determining expected bits on the first lane based on application of the bit error vector to the first lane;
comparing the expected bits to corresponding bits received on the first lane; and
determining that the corresponding bits do not match the expected bits, wherein the first bit errors are identified based on non-matching ones of the corresponding bits.

* * * * *